(12) United States Patent
Morrison

(10) Patent No.: US 11,837,838 B1
(45) Date of Patent: Dec. 5, 2023

(54) LASER HAVING TAPERED REGION

(71) Applicant: Freedom Photonics LLC, Goleta, CA (US)

(72) Inventor: Gordon Barbour Morrison, Summerland, CA (US)

(73) Assignee: Freedom Photonics LLC, Goleta, CA (US)

( * ) Notice: Subject to any disclaimer, the term of this patent is extended or adjusted under 35 U.S.C. 154(b) by 128 days.

(21) Appl. No.: 17/163,028

(22) Filed: Jan. 29, 2021

Related U.S. Application Data

(60) Provisional application No. 62/968,966, filed on Jan. 31, 2020.

(51) Int. Cl.
*H01S 5/10* (2021.01)
*H01S 5/125* (2006.01)
*H01S 5/042* (2006.01)

(52) U.S. Cl.
CPC ........ *H01S 5/1007* (2013.01); *H01S 5/04256* (2019.08); *H01S 5/101* (2013.01); *H01S 5/1014* (2013.01); *H01S 5/1064* (2013.01); *H01S 5/125* (2013.01); *H01S 2301/166* (2013.01)

(58) Field of Classification Search
CPC ...... H01S 5/101; H01S 5/1007; H01S 5/1014; H01S 5/1064; H01S 5/1003; H01S 5/1053; H01S 2301/166; H01S 5/125
See application file for complete search history.

(56) References Cited

U.S. PATENT DOCUMENTS

| | | | | |
|---|---|---|---|---|
| 4,282,494 A | * | 8/1981 | Yonezu | H01S 5/16 372/43.01 |
| 4,284,963 A | * | 8/1981 | Allen, Jr. | H01S 5/1021 372/50.1 |
| 4,349,905 A | * | 9/1982 | Ackley | H01S 5/10 372/46.01 |
| 4,689,797 A | * | 8/1987 | Olshansky | H01S 5/16 372/50.1 |
| 4,744,089 A | * | 5/1988 | Montroll | H01S 5/50 372/50.22 |
| 4,783,788 A | * | 11/1988 | Gordon | H01S 5/10 372/50.1 |

(Continued)

FOREIGN PATENT DOCUMENTS

| | | | | |
|---|---|---|---|---|
| CN | 110061420 A | * | 7/2019 | ........ H01S 5/0287 |
| DE | 4132585 A1 | * | 4/1992 | |

(Continued)

OTHER PUBLICATIONS

Rauter et al., "Single-mode Tapered Quantum Cascade Lasers", 2013, Appl. Phys. Lett. 102, 181102. (Year: 2013).*

(Continued)

*Primary Examiner* — Joshua King
(74) *Attorney, Agent, or Firm* — KNOBBE, MARTENS, OLSON & BEAR, LLP

(57) ABSTRACT

Various designs of semiconductor lasers may comprise a waveguide having a front region that is configured to support a plurality of transverse laser cavity modes and a rear region that support only one transverse laser cavity mode. These front and rear regions may be disposed between front and rear reflectors and may provide optical gain. Some such designs may be useful for providing higher power single mode semiconductor lasers.

29 Claims, 8 Drawing Sheets

(56) References Cited

U.S. PATENT DOCUMENTS

| | | | | |
|---|---|---|---|---|
| 4,856,017 A * | 8/1989 | Ungar | | H01S 5/10 |
| | | | | 372/50.1 |
| 4,942,585 A * | 7/1990 | Ungar | | H01S 5/028 |
| | | | | 372/44.011 |
| 4,993,035 A * | 2/1991 | Laikhtman | | H01S 5/141 |
| | | | | 372/50.23 |
| 5,003,550 A * | 3/1991 | Welch | | H01S 5/50 |
| | | | | 372/45.01 |
| 5,260,822 A * | 11/1993 | Missaggia | | H01S 5/10 |
| | | | | 359/344 |
| 5,539,571 A * | 7/1996 | Welch | | H01S 5/04256 |
| | | | | 359/344 |
| 5,555,544 A * | 9/1996 | Walpole | | H01S 5/10 |
| | | | | 372/50.1 |
| 5,592,503 A * | 1/1997 | Welch | | G02B 6/305 |
| | | | | 372/50.11 |
| 5,602,866 A * | 2/1997 | Fukunaga | | H01S 5/32308 |
| | | | | 372/102 |
| 5,652,812 A * | 7/1997 | Gurib | | G02B 6/12004 |
| | | | | 385/14 |
| 5,657,339 A * | 8/1997 | Fukunaga | | H01S 5/10 |
| | | | | 372/50.11 |
| 5,689,358 A * | 11/1997 | Nakao | | H01S 5/227 |
| | | | | 257/14 |
| 5,737,474 A * | 4/1998 | Aoki | | H01S 5/2231 |
| | | | | 385/132 |
| 5,793,521 A * | 8/1998 | O'Brien | | H01S 5/026 |
| | | | | 359/344 |
| 5,914,978 A * | 6/1999 | Welch | | G02B 6/305 |
| | | | | 372/20 |
| 6,014,396 A * | 1/2000 | Osinski | | H01S 5/10 |
| | | | | 372/50.23 |
| 6,104,738 A * | 8/2000 | Kitoh | | H01S 5/0202 |
| | | | | 372/96 |
| 6,130,903 A * | 10/2000 | Moloney | | H01S 5/50 |
| | | | | 359/244 |
| 6,148,014 A * | 11/2000 | Geels | | H01S 5/04254 |
| | | | | 372/46.01 |
| 6,229,947 B1 * | 5/2001 | Vawter | | G02B 6/1228 |
| | | | | 385/132 |
| 6,246,709 B1 * | 6/2001 | Oshiba | | H01S 5/026 |
| | | | | 372/50.1 |
| 6,301,283 B1 * | 10/2001 | Chen | | H01S 5/12 |
| | | | | 372/96 |
| 6,375,364 B1 * | 4/2002 | Wu | | H01S 5/22 |
| | | | | 385/11 |
| 6,499,888 B1 * | 12/2002 | Wu | | G02B 6/4203 |
| | | | | 385/88 |
| 6,542,532 B1 * | 4/2003 | Nakamura | | H01S 5/10 |
| | | | | 372/50.1 |
| 6,600,764 B1 * | 7/2003 | Garbuzov | | H01S 5/10 |
| | | | | 372/46.01 |
| 6,768,758 B1 * | 7/2004 | Hamamoto | | H01S 5/10 |
| | | | | 372/50.22 |
| 6,777,768 B2 * | 8/2004 | Goldstein | | H01S 5/50 |
| | | | | 257/97 |
| 6,810,054 B2 * | 10/2004 | Sousa | | H01S 5/2231 |
| | | | | 372/45.01 |
| 6,813,068 B2 * | 11/2004 | Hamamoto | | H01S 5/50 |
| | | | | 359/344 |
| 6,816,531 B1 * | 11/2004 | Rossin | | H01S 5/146 |
| | | | | 372/54 |
| 6,928,097 B2 * | 8/2005 | Chida | | H01S 5/227 |
| | | | | 372/46.01 |
| 7,184,207 B1 * | 2/2007 | Walker | | G02F 1/025 |
| | | | | 359/344 |
| 7,388,894 B2 | 6/2008 | O'Daniel et al. | | |
| 7,542,500 B2 * | 6/2009 | Takayama | | H01S 5/4031 |
| | | | | 372/45.01 |
| 7,643,207 B2 | 1/2010 | Dagens et al. | | |
| 8,306,084 B2 * | 11/2012 | Reill | | H01S 5/22 |
| | | | | 372/50.12 |
| 8,384,993 B2 | 2/2013 | Landais et al. | | |
| 8,786,941 B2 | 7/2014 | Kuramoto et al. | | |
| 9,166,368 B2 * | 10/2015 | Kanskar | | H01S 5/1014 |
| 10,270,224 B2 * | 4/2019 | Kanskar | | H01S 5/1064 |
| 10,320,152 B2 | 6/2019 | Morrison | | |
| 10,355,451 B2 | 7/2019 | Morrison et al. | | |
| 10,498,105 B2 * | 12/2019 | Fricke | | H01S 5/1064 |
| 2001/0014109 A1 | 8/2001 | Hamamoto | | H01S 5/10 |
| | | | | 372/46.01 |
| 2002/0037021 A1 * | 3/2002 | Ohkubo | | H01S 5/16 |
| | | | | 372/46.01 |
| 2002/0141467 A1 * | 10/2002 | Iwai | | B82Y 20/00 |
| | | | | 372/45.01 |
| 2003/0057427 A1 * | 3/2003 | Chida | | H01S 5/227 |
| | | | | 257/98 |
| 2003/0219053 A1 * | 11/2003 | Swint | | H01S 5/10 |
| | | | | 372/46.01 |
| 2004/0131102 A1 * | 7/2004 | Jette | | B82Y 20/00 |
| | | | | 372/97 |
| 2004/0233957 A1 * | 11/2004 | Ito | | B82Y 20/00 |
| | | | | 372/46.01 |
| 2005/0092979 A1 * | 5/2005 | Han | | H01S 5/125 |
| | | | | 257/11 |
| 2006/0256829 A1 * | 11/2006 | Koyata | | H01S 5/1014 |
| | | | | 372/102 |
| 2006/0274802 A1 * | 12/2006 | Aoki | | B82Y 20/00 |
| | | | | 372/50.12 |
| 2008/0112450 A1 * | 5/2008 | Krakowski | | H01S 5/10 |
| | | | | 372/45.01 |
| 2009/0232169 A1 * | 9/2009 | Koyata | | G02F 1/3775 |
| | | | | 372/22 |
| 2009/0290612 A1 * | 11/2009 | Yamaguchi | | H01S 5/2231 |
| | | | | 372/46.012 |
| 2010/0080255 A1 * | 4/2010 | Sugahara | | H01S 5/10 |
| | | | | 372/45.01 |
| 2010/0247033 A1 * | 9/2010 | Shoji | | H01S 5/0265 |
| | | | | 372/45.01 |
| 2011/0032956 A1 * | 2/2011 | Kanskar | | H01S 5/18397 |
| | | | | 977/773 |
| 2012/0177077 A1 * | 7/2012 | Erbert | | H01S 5/2036 |
| | | | | 372/50.11 |
| 2012/0236886 A1 * | 9/2012 | Oki | | H01S 5/0602 |
| | | | | 372/44.01 |
| 2013/0089115 A1 * | 4/2013 | Kanskar | | H01S 5/12 |
| | | | | 372/50.23 |
| 2014/0055842 A1 * | 2/2014 | Kiyota | | H01S 5/1014 |
| | | | | 359/341.1 |
| 2014/0064311 A1 * | 3/2014 | Eichler | | H01S 5/2219 |
| | | | | 372/45.01 |
| 2014/0254617 A1 * | 9/2014 | Oh | | H01S 3/1062 |
| | | | | 372/20 |
| 2014/0300953 A1 * | 10/2014 | Whitbread | | H01S 5/041 |
| | | | | 359/344 |
| 2014/0301421 A1 * | 10/2014 | Kanskar | | H01S 5/2036 |
| | | | | 372/46.01 |
| 2015/0092800 A1 * | 4/2015 | Zucker | | H01S 5/0265 |
| | | | | 372/29.015 |
| 2015/0288140 A1 * | 10/2015 | Davies | | H01S 5/1064 |
| | | | | 372/33 |
| 2017/0063046 A1 * | 3/2017 | Fukagai | | H01S 5/1014 |
| 2017/0179679 A1 * | 6/2017 | Lee | | G02B 6/14 |
| 2017/0250522 A1 * | 8/2017 | Koda | | H01S 5/5081 |
| 2017/0310080 A1 * | 10/2017 | Zhu | | H01S 5/1014 |
| 2018/0287342 A1 * | 10/2018 | Morrison | | H01S 5/06255 |
| 2018/0287343 A1 * | 10/2018 | Morrison | | H01S 5/1209 |
| 2018/0323579 A1 * | 11/2018 | Kaji | | G02B 6/32 |
| 2019/0273359 A1 * | 9/2019 | Erbert | | G02B 6/124 |
| 2020/0227894 A1 * | 7/2020 | Reboud | | H01S 5/06256 |
| 2023/0023686 A1 | 1/2023 | Leisher et al. | | |

FOREIGN PATENT DOCUMENTS

| | | | | |
|---|---|---|---|---|
| DE | 102017114732 A1 * | 1/2019 | | |
| EP | 2641304 B1 * | 12/2014 | | G02B 6/12004 |
| FR | 3032562 A1 * | 8/2016 | | G02B 27/10 |
| JP | H08181383 A * | 7/1996 | | |

(56) References Cited

FOREIGN PATENT DOCUMENTS

| JP | 2695440 | B2 | * | 12/1997 | |
|----|---------|----|----|---------|--|
| JP | 11340563 | A | * | 12/1999 | |
| JP | 2000200940 | A | * | 7/2000 | |
| JP | 2002124733 | A | * | 4/2002 | ............... H01S 5/16 |
| JP | 2003101139 | A | * | 4/2003 | ............. H01S 5/227 |
| JP | 2003518777 | A | * | 6/2003 | |
| JP | 2008066506 | A | * | 3/2008 | ........... H01S 5/4031 |
| JP | 2012509583 | A | * | 4/2012 | |
| KR | 20020081237 | A | * | 10/2002 | |
| KR | 10-2014-0060460 | | | 5/2014 | |
| WO | WO-2005033791 | A1 | * | 4/2005 | ........... G02F 1/3775 |
| WO | WO-2006110770 | A2 | * | 10/2006 | ........... H01S 5/1082 |
| WO | WO-2008010374 | A1 | * | 1/2008 | ............. B82Y 20/00 |
| WO | WO-2009116947 | A1 | * | 9/2009 | ........ H01S 5/06256 |
| WO | WO-2016197137 | A1 | * | 12/2016 | ........... H01S 5/1003 |
| WO | WO-2017220144 | A1 | * | 12/2017 | |
| WO | WO-2018197015 | A1 | * | 11/2018 | |
| WO | WO-2021053711 | A1 | * | 3/2021 | ........... H01L 31/105 |

OTHER PUBLICATIONS

International Search Report and Written Opinion in PCT Application No. PCT/US2022*033123, dated Oct. 6, 2022, in 6 pages.

* cited by examiner

LASER HAVING TAPERED REGION

INCORPORATION BY REFERENCE TO ANY PRIORITY APPLICATIONS

This application claims the benefit of priority of U.S. Provisional Application No. 62/968,966 titled "Laser Having Tapered Region" (Docket No. FREDOM.025PR), which was filed on Jan. 31, 2020, the entire disclosure of which is expressly incorporated herein by reference.

BACKGROUND

Field of the Invention

Various embodiments of this application relate to the field of semiconductor lasers and more particularly single-mode semiconductor lasers.

Description of the Related Art

Lasers are widely used in telecommunications, sensing, test and measurement, as well as other applications. Some such applications call for the use of single mode lasers. Some such applications also may benefit from lasers having high laser output. Many high-power lasers, however, are not single-mode while many single-mode lasers do not provide high optical powers. Accordingly, it would be advantageous to have high-power single-mode lasers.

SUMMARY

A variety of semiconductor lasers designs are disclosed herein. Some such design are capable of providing high optical power and single mode operation.

Example embodiments described herein have several features, no single one of which is indispensable or solely responsible for their desirable attributes. A variety of example systems and methods are provided below.

Example 1: A semiconductor laser comprising:
  a waveguide comprising:
    (i) a first waveguide region extending in a longitudinal direction between first and second ends of said first waveguide region and having a width extending in a lateral direction; and
    (ii) a second waveguide region extending in a longitudinal direction between first and second ends of said second waveguide region and having a width extending in a lateral direction; and
  first and second optical reflectors, said first and second waveguide regions disposed between said first and second optical reflectors, said first reflector closer to said first end of said first waveguide region than said second end of said first waveguide region, said second optical reflector closer to said second end of said second waveguide region than said first end of said second waveguide region, said first and second optical reflectors disposed with respect to each other to form a laser cavity therebetween,
  wherein at least a portion of said waveguide between said first and second optical reflectors comprises semiconductor material configured to provide optical gain for light propagating within said laser cavity, and
  wherein said first waveguide region or said first waveguide region and said first reflector are configured to preferentially support propagation of only one bound transverse mode as compared to other bound transverse modes while said second region is configured such that it may support a plurality of bound transverse modes.

Example 2: The laser of Example 1, wherein said second waveguide region has a width such that said second waveguide region supports multiple bound transverse modes.

Example 3: The laser of Examples 1 or 2, wherein said first waveguide region has a width such that said first waveguide region supports only a single bound transverse mode.

Example 4: The laser of Examples 1 or 2, wherein said first waveguide region supports a plurality of bound transverse modes and said first optical reflector filters out at least one such bound transverse modes such that the combination of said first waveguide region and said first optical reflector support lasing of only one bound transverse mode.

Example 5: The laser of any of the above examples, wherein said first and second waveguide regions each have an average width, and said average width of said first waveguide region is smaller than the average width of said second waveguide region.

Example 6: The laser of any of the above examples, wherein the width of said second waveguide region along most of the longitudinal direction is greater than a maximum width of said first waveguide region.

Example 7: The laser of any of the above examples, wherein the width of said second waveguide region along the entire longitudinal direction is equal to or greater than a maximum width of said first waveguide region.

Example 8: The laser of any of the above examples, wherein the width of said first region is in a range from 1 to 20 microns.

Example 9: The laser of any of the above examples, wherein the width of said second region is in a range from 10 and 500 microns.

Example 10: The laser of any of the above examples, wherein the width at said second end of said second waveguide region is larger than the width at said first end of said second waveguide region.

Example 11: The laser of any of Examples 1-10, wherein the second waveguide region tapers from said first end to said second end.

Example 12: The laser of any of Examples 1-10, wherein the second waveguide region is flared.

Example 13: The laser of any of Examples 1-10, wherein the width of the second waveguide region increases progressively from said first end to said second end.

Example 14: The laser of any of the above examples, wherein the second region increases in width over a distance in the longitudinal direction in the range of from 100 micrometers to 1 centimeter.

Example 15: The laser of any of the above examples, wherein the first waveguide region is trapezoidal in shape.

Example 16: The laser of any of the above examples, wherein the width of said first waveguide region is the same at said first and second ends.

Example 17: The laser of any of the above examples, wherein the first waveguide region is rectangular in shape.

Example 18: The laser of Examples 1-15, wherein the width at said second end of said first waveguide region is larger than the width at said first end of said first waveguide region.

Example 19: The laser of any of Examples 1-15, wherein the first waveguide region tapers from said first end to said second end.

Example 20: The laser of any of Examples 1-15, wherein the first waveguide region is flared.

Example 21: The laser of any of Examples 1-15, wherein the width of the first waveguide region increases progressively from said first end to said second end.

Example 22: The laser of any of the above examples, wherein said first reflector comprises a narrow band reflector.

Example 23: The laser of any of the above examples, wherein said first reflector comprises a distributed Bragg reflector.

Example 24: The laser of any of Examples 1-21, wherein said first reflector comprises a sampled grating distributed Bragg reflector.

Example 25: The laser of any of Examples 1-21 and 24, wherein said first reflector comprises a comb mirror.

Example 26: The laser of any of the above examples, wherein said second reflector comprises a narrow band reflector.

Example 27: The laser of any of the examples above, wherein said second reflector comprises a distributed Bragg reflector.

Example 28: The laser of any of Examples 1-25 and 27, wherein said second reflector comprises a sampled grating distributed Bragg reflector.

Example 29: The laser of any of Examples 1-25, 27 and 28, wherein said second reflector comprises a comb mirror.

Example 30: The laser of any of Examples 1-25, wherein said second reflector comprises a broad band mirror.

Example 31: The laser of any of Examples 1-26 and 30, wherein said second reflector comprises a partially reflecting facet.

Example 32: The laser of any the examples above, wherein said first optical reflector comprises a passive element.

Example 33: The laser of any of Examples 1-31, wherein said first optical reflector comprises an active optical element.

Example 34: The laser of any of Examples 1-31 and 33, wherein said first optical reflector is configured to provide gain.

Example 35: The laser of any of Examples 1-31, 33, and 34, further comprising an electrode disposed with respect to said first optical reflector to apply an electric energy thereto provide gain.

Example 36: The laser of any of Examples 1-31, 33, and 34, further comprising an electrode disposed with respect to said first optical reflector to apply an electric signal thereto to tune said first optical reflector.

Example 37: The laser of any of examples above, wherein said second optical reflector comprises a passive element.

Example 38: The laser of any of Examples 1-36, wherein said second optical reflector comprises an active optical element.

Example 39: The laser of any of Examples 1-36 and 38, wherein said second optical reflector may be configured to provide gain.

Example 40: The laser of any of Examples 1-36, 38 and 39, further comprising an electrode disposed with respect to said second optical reflector to apply an electric energy thereto provide gain.

Example 41: The laser of any of Examples 1-36, 38 and 39, further comprising an electrode disposed with respect to said second optical reflector to apply an electric signal thereto to tune said second optical reflector.

Example 42: The laser of any of the examples above, wherein said first waveguide region is configured to increase loss of higher order bound transverse modes by increasing scattering.

Example 43: The laser of any of the examples above, wherein said first waveguide region is curved thereby increasing scattering loss of bound transverse modes higher than the fundamental mode.

Example 44: The laser of any of the examples above, wherein said first waveguide region comprises a curved strip.

Example 45: The laser of any of the examples above, wherein said waveguide further comprises a tunable phase section having an index of refraction that can be adjusted to increase or decrease the optical path length in said section of said waveguide.

Example 46: The tunable laser of any of Examples 1-44, further comprising a phase section configured to introduce a change in optical path of an optical signal in the laser cavity, wherein the phase section is configured to be electrically or thermally controlled.

Example 47: The laser of any of Examples 1-44, further comprising an electrode disposed with respect to a portion of said waveguide to form said tunable phase section by altering the index of refraction of semiconductor material comprising said waveguide with application of an electrical signal to said electrode.

Example 48: The laser of any of the examples above, further comprising an optical amplifier at said second end of said second waveguide region.

Example 49: The laser of Example 48, wherein said optical amplifier comprises a waveguide region having a first end and a second end, said first end of said optical amplifier closer to said second waveguide region than said first waveguide region Example 50: The laser of any of the examples above, wherein the waveguide is included on a substrate comprising a crystalline material.

Example 51: The laser of Example 50, wherein the substrate comprises a crystalline material.

Example 52: The laser of Example 51, wherein the substrate comprises III-V material.

Example 53: The laser of any of the examples above, wherein waveguide comprises III-V semiconductor material.

Example 54: The laser of any of the examples above, wherein said waveguide includes a portion having gain that comprises a multi-quantum well semiconductor heterojunction.

Example 55: The laser of any of the examples above, wherein said laser comprises a single mode laser.

Example 56: The laser of any of the examples above, wherein said first region and said first reflector are configured to provide less loss for only one bound transverse mode as compared to other bound transverse modes.

Example 57: The laser of any of the examples above, wherein said first region and said first reflector are configured to provide more gain for only one bound transverse mode as compared to other bound transverse modes.

Example 58: The laser of any of the examples above, wherein said first region and said first reflector are configured to provide more reflectivity for only one bound transverse mode as compared to other bound transverse modes.

Example 59: The laser of any of the examples above, wherein said first waveguide region and said first reflector are configured to reflect only one bound transverse mode at the second end of the first waveguide region.

Example 60: The laser of any of the examples above, wherein said second waveguide region is configured to provide optical gain to a plurality of bound transverse modes.

Example 61: The laser of any of the examples above, wherein the combination of the first and second optical reflectors and the first and second said optical waveguide regions form a laser cavity than can sustain only a single transverse laser cavity optical mode.

Example 62: The laser of any of the examples above, wherein the said laser cavity outputs a single transverse laser cavity mode.

Example 63: The laser of any of the examples above, wherein said second waveguide region has a width such that it can support propagation of multiple bound transverse modes.

Example 64: The laser of any of the examples above, wherein said first waveguide region has a width such that said first waveguide region supports propagation of a single bound transverse mode.

Example 65: The laser of any of the examples above, wherein at least a portion of the said first waveguide region supports propagation of a plurality of bound transverse modes and said first optical reflector only reflects one of the bound transverse modes such that the combination of said reflectors and said waveguide regions only sustain one transverse laser cavity mode.

Example 66: The laser of any of the examples above, wherein said only one bound transverse mode comprises a fundamental mode.

Example 67: The laser of any of the examples above, wherein said only one bound transverse mode comprises a fundamental mode of said waveguide in said first region.

Example 68: The laser of any of the examples above, wherein said first waveguide region is configured to increase loss of bound transverse modes higher than the fundamental mode.

Example 69: The laser of any of the examples above, wherein said first waveguide region is configured to increase loss of bound transverse modes higher than the fundamental mode by increasing scattering.

Example 70: The laser of any of the examples above, wherein said first waveguide region is configured to preferentially support propagation of only one bound transverse mode as compared to other bound transverse modes while said second region is configured such that it may support a plurality of bound transverse modes.

Example 71: The laser of any of the examples above, wherein said first waveguide region is configured to provide less loss for only one bound transverse mode as compared to other bound transverse modes.

Example 72: The laser of any of the examples above, wherein said first waveguide region is configured to provide more gain for only one bound transverse mode as compared to other bound transverse modes.

Example 73: The laser of any of the examples above, wherein said first waveguide region and said first reflector are configured to preferentially support propagation of only one bound transverse mode as compared to other bound transverse modes while said second region is configured such that it may support a plurality of bound transverse modes.

Example 74: The laser of any of the examples above, wherein said first reflector is configured to provide more reflectivity for only one bound transverse mode as compared to other bound transverse modes.

Example 75: The laser of any of the examples above, wherein said first reflector is configured to reflect only one bound transverse mode at the second end of the first waveguide region.

Example 76: The laser of any of the examples above, wherein the laser comprises a Y branch laser.

Example 77: The laser of any of the examples above, wherein the first and second waveguide regions are included in one branch of a Y branch laser.

Example 78: A semiconductor laser comprising:
a waveguide comprising:
  (i) a first waveguide region extending in a longitudinal direction between first and second ends of said first waveguide region and having a width extending in a lateral direction; and
  (ii) a second waveguide region extending in a longitudinal direction between first and second ends of said second waveguide region and having a width extending in a lateral direction; and
first and second optical reflectors, said first and second waveguide regions disposed between said first and second optical reflectors, said first reflector closer to said first end of said first waveguide region than said second end of said first waveguide region, said second optical reflector closer to said second end of said second waveguide region than said first end of said second waveguide region, said first and second optical reflectors disposed with respect to each other to form a laser cavity therebetween,
wherein at least a portion of said waveguide between said first and second optical reflectors comprises semiconductor material configured to provide optical gain for light propagating within said laser cavity, and
wherein said first waveguide region is configured to have more loss for higher order transverse modes than said second waveguide region.

Example 79: The laser of any of the examples above, wherein said first waveguide region is configured to preferentially support propagation of a lower number of bound transverse modes than said second waveguide region.

Example 80: A Y-branch laser comprising:
first, second, and third waveguide branches connected together in a Y-branch configuration at proximal end thereof;
first, second, and third reflectors at distal ends of said first, second, and third waveguide branches, respectively,
wherein said first waveguide branch comprises:
  (i) a first waveguide region extending in a longitudinal direction between first and second ends of said first waveguide region and having a width extending in a lateral direction; and
  (ii) a second waveguide region extending in a longitudinal direction between first and second ends of said second waveguide region and having a width extending in a lateral direction; and
said first reflector closer to said second end of said second waveguide region than said first end of said second waveguide region,
wherein at least a portion of said first waveguide branch comprises semiconductor material configured to provide optical gain, and
wherein said first waveguide region is configured to have more propagation loss for higher order transverse modes than said second waveguide region.

Example 81: The laser of any of the examples above, wherein said first waveguide region of said first waveguide branch is configured to preferentially support propagation of a lesser number of bound transverse modes than said second waveguide region of said first waveguide branch Example 82: The laser of any of the examples above, wherein said first, second and third optical reflectors are disposed with respect to each other to form a laser cavity.

Example 83: A wavelength tunable laser comprising:
at least one waveguide;
at least one comb reflector comprising a plurality of reflective regions, the at least one comb reflector having a plurality of reflection peaks in a wavelength range;
at least one broadband reflector having substantially uniform reflectivity for wavelengths in the wavelength range; and
at least one laser cavity formed by the at least one comb reflector and the at least one broadband reflector, the at least one laser cavity having a plurality of modes, an optical length of the at least one laser cavity configured such that a non-integer number of the modes are between consecutive reflection peaks of the at least one comb reflector;
wherein the at least one waveguide comprises a first waveguide, a second waveguide, and a third waveguide in a Y-branch configuration; and
wherein the at least one broadband reflector comprises a first broadband reflector disposed at an end of the first waveguide, and the at least one comb reflector comprises a first comb reflector disposed at an end of the second waveguide and a second comb reflector disposed at an end of the third waveguide.

Example 84: The laser of Example 83, wherein the wavelength range is between 650 nm and 1950 nm.

Example 85: The laser of Example 84, wherein the wavelength range comprises at least one of a first range of 1250 nm to 1360 nm, a second range of 1500 nm to 1580 nm, or a third range of 1600 nm to 1700 nm.

Example 86: The laser of any of Examples 83-85, further comprising one or more electrodes configured to provide electrical current or voltage to move the reflection peaks of the first comb reflector and/or the second comb reflector with respect to the modes to select a desired lasing wavelength.

Example 87: The laser of any of Examples 83-86, wherein the first comb reflector and the second comb reflector comprise a periodically chirped reflector, a superstructure grating, or a sampled grating distributed Bragg reflector.

BRIEF DESCRIPTION OF THE DRAWINGS

In the following description of the various embodiments, reference is made to the accompanying drawings which form a part hereof, and in which is shown by way of illustration various embodiments of the device.

It is to be understood that other embodiments may be utilized and structural changes may be made without departing from the scope of present invention.

Figure 1:
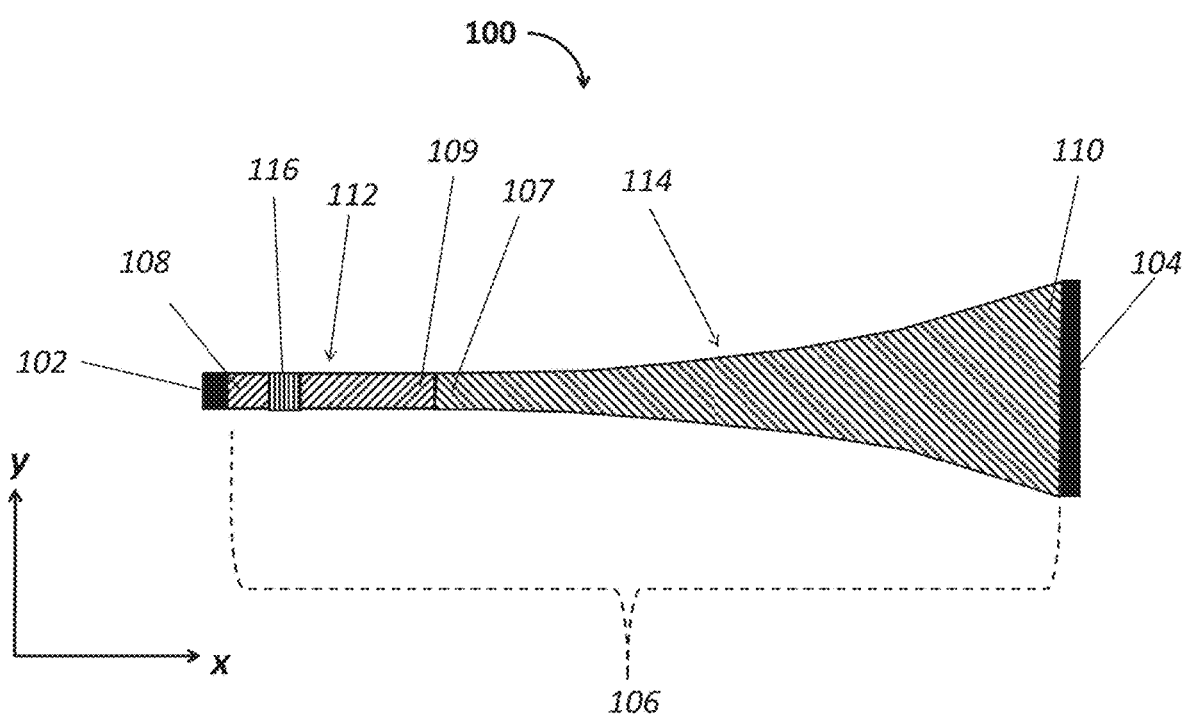
FIG. 1 illustrates a semiconductor laser comprising a waveguide and two reflectors. The waveguide includes first and second, for example, rearward and forward, waveguide regions, wherein the rearward waveguide region has a constant width and the forward waveguide region that is flared.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements. In addition, where applicable, the first one or two digits of a reference numeral for an element can frequently indicate the figure number in which the element first appears.

DETAILED DESCRIPTION OF CERTAIN PREFERRED EMBODIMENTS

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements may be present therebetween. For clarity of description, "reflector" or "mirror" can be used interchangeably to refer to an optical element and/or a surface having a reflectivity greater than or equal to about 0.01% and less than or equal to 100%. For example, an optical element and/or a surface having a reflectivity greater than or equal to about 5% and less than or equal to 99%, greater than or equal to about 10% and less than or equal to 90%, greater than or equal to about 15% and less than or equal to 80%, greater than or equal to about 20% and less than or equal to 70%, greater than or equal to about 30% and less than or equal to 60%, or any value in any range/sub-range defined by these values can be considered as a reflector or mirror.

Semiconductor lasers are widely used in many applications ranging from telecommunications to sensing, medical applications, and optical pumping (e.g. pumping other laser mediums or amplifier mediums) to name a few. A semiconductor laser can comprise a substrate having an optically active layer thereon. In various implementations, the optically active layer be an epitaxial layer grown over the substrate using semiconductor growth technology. In many implementations, III-V semiconductor materials are employed. The laser may comprise an optical resonator formed by at least two optical reflectors such as front and rear or forward and rearward optical reflectors. The optical resonator may be referred to herein as an optical cavity or laser cavity in some instances. A region having optical gain may be included in the optical resonator such as between the front and rear optical reflectors such that light with the laser cavity resonates and the laser lases outputting light through the front optical reflector. The light output from the laser may have one or more laser wavelengths. The one or more laser wavelengths may be determined based at least in part on a spectrum of the optical gain and wavelengths of one or more cavity modes (laser cavity modes). Various semiconductor laser designs such as described herein comprise an optical waveguide in which laser light propagates. At least a portion of the waveguide may be disposed within the optical cavity and at least part of this waveguide may have optical gain so as to facilitate such lasing. Optical cavities or laser cavities may support multiple longitudinal and multiple transverse optical modes at the one or more laser wavelengths. Accordingly, certain lasers may support and/or output multiple longitudinal and/or multiple transverse laser modes (e.g., at the one or more laser wavelengths). As described above, however, for many applications semiconductor lasers that supporting and/or outputting only a single transverse mode such as the fundamental mode can be advantageous. Moreover, for some applications, it may be beneficial for semiconductor lasers to support and/or output not only a single transverse mode but also only a single longitudinal mode. In either case, having high output optical power may also be desirable.

As an example, semiconductor lasers may be configured to output a single transverse mode (e.g., the fundamental mode) and this semiconductor laser may have an output optical power at least or larger than 30 mW, or at least or larger than 50 mW, or at least or larger than 100 mW or at least or larger than 500 mW or of at least 600 mW or at least 750 mW or at least 1 W or at least 2 W, or at least 3 W, at least 5 W, at least 10 W, or at least 15 W or more for some designs. In various implementations, the laser may have an output power in a range defined by any combination of these values. Outputting a single transverse mode (e.g., the fundamental mode) with such level of output power may be achieved in some implementations described herein by including a first section (e.g., a first waveguide section) of the laser configured to support a single transverse mode and a second section (a second waveguide section) configured to support multiple transverse modes. For example, the second section, supporting multiple transverse modes, may include optical gain and enable enhanced optical power to be obtained. The first section, supporting only a single transverse optical mode (e.g., fundamental mode), may be useful in filtering out higher order transverse modes (e.g., modes higher than fundamental mode) from the laser cavity modes supported and amplified by the second section. In some implementations, the first section may also provide optical gain and contribute to the generation and amplification of laser light. A wide variety of variations in design are possible. The number of multiple transverse modes supported by the first or the second section (e.g., first or the second waveguide section) may be associated with the one or more laser wavelengths.

FIG. 1 shows an example of the semiconductor laser 100 comprising two waveguide sections, one supporting a number of transverse optical modes (bound or non-radiative transverse optical modes) and another supporting only one transverse optical mode (bound or non-radiative transverse optical mode). The laser device 100 comprises: a first optical reflector 102, a second optical reflector 104, a waveguide 106 extending in a longitudinal direction between the first optical reflector 102 and second optical reflector 104. (In this example, the longitudinal direction is shown parallel to the x-axis). The waveguide 106 comprises a first waveguide region 112 having first 108 and second 109 ends and a second waveguide region 114 having first 107 and second 110 ends. In the example shown, the second end 109 of the first waveguide region 112 is proximal to, for example, abuts, the first end 107 of the second waveguide region 114. The waveguide 106 has a width in the lateral direction (parallel to the y-axis), here shown as orthogonal to the longitudinal direction (e.g., x-direction). In the implementation shown in FIG. 1, the width of the waveguide in the second waveguide region 114 increases in size from the first end 107 to the second end 110 of the second waveguide region 114. Moreover, this second waveguide 114 has a width configured to support a plurality of transverse modes at least in a portion of the second waveguide region 114. In contrast, the first waveguide region 112 has a reduced width, compared to, for example, an average width of the second waveguide region 114, that may be configured to only support one transverse optical mode. Additionally, at least an active portion of the second waveguide region provides optical gain for example, at a laser output wavelength (e.g. 1550 nm). In some designs, the reduced width of the first waveguide region 112 may not substantially change along the longitudinal direction.

In the example shown in FIG. 1, the width of the first waveguide region 112 and the width of the second waveguide region 114 are equal at the interface where the first waveguide region 112 and the second waveguide region 114 meet (e.g., in the vicinity of the second end 109 of the first waveguide region 112 and the first end 107 of the second waveguide region 114). Also, in this example, the first reflector 102 may have a width (e.g., a width that does not change along the longitudinal direction) that is equal to the width of the first waveguide region 112, and the second reflector 104 has a width that is equal to the width of the second waveguide region 114 at the second end 110 (e.g., at the front or front edge of the second region 114).

The first reflector 102, the waveguide 106 and the second reflector 104 provide an optical path over which light propagates. Moreover, the first reflector 102, the waveguide 106 (with at least one optical gain region) and the second reflector 104 form an active laser cavity that can support lasing at one or more laser wavelengths corresponding to wavelengths of one or more cavity modes the active laser cavity. The active laser cavity can generate, amplify and sustain laser light a portion of which is output therefrom. The one or more laser wavelengths may be determined by a spectrum of the optical gain (provided by the second waveguide region) and/or wavelengths of the one or more cavity modes (laser cavity modes). Due to the second waveguide regions sufficiently large lateral width, the second waveguide region (that has optical gain) can provide high optical amplification resulting in laser power enhancement. The laser output beam can be output from at least one of the reflectors, such as the second (e.g., forward) reflector 104 at the second end 110 of the second (e.g., flared) waveguide region 114. This front reflector 104 may therefore be partially transmitting so as to transmit light circulating and/or lasing within the laser cavity out the front of the semiconductor laser 100.

In some implementations, the combination of the first reflector 102 and the first waveguide region 112 may only support lasing of one transverse mode (e.g., the fundamental mode), by introducing sufficient optical loss (e.g., radiative loss, or coupling loss) to other transverse optical modes (e.g., higher order transverse modes) to inhibit lasing thereof. For example, a round trip loss for a transverse mode, may be larger than a threshold loss below which the transverse mode can lase. In some examples, the roundtrip loss may be associated with optical energy lost in an optical roundtrip between the first reflector 102 and the second reflector 104. As a result, despite the second waveguide region 114 supporting multiple transverse modes, the combination of the first reflector 102, the two waveguide regions 112, 114 and the second reflector 104 form a laser cavity that supports lasing or sustains only a single transverse mode. This laser cavity, in particular, due to the contribution of the second waveguide region 114 (e.g., the active portion of the second waveguide region), which may have an increased area that provides an enhanced optical gain, provides high optical gain to the laser device, e.g., to the light circulating within the laser cavity. As a result, the laser can output a single transverse mode having a high optical power. An enhanced optical gain may be larger than an optical gain that may be provided by an active portion of a single mode waveguide having the same length as the second waveguide region 114 (along x-axis).

Accordingly, in various designs, the first reflector 102 and the first waveguide region 112 may effectively function as a "spatial optical filter" filtering out transverse modes (e.g., some of the transverse modes such as higher order transverse modes), supported by the second waveguide region 114. These extra transverse modes (e.g., the transverse modes other than a fundamental transverse mode) may have increased loss in the first waveguide region 112 so as to be suppressed by the first waveguide region (e.g., to be radiated or coupled out of the first waveguide region 112). In implementations where both waveguide regions provide optical gain, the first waveguide region 112 which may operate as a spatial filter may also contribute to the generation and amplification of laser light, in addition to eliminating higher order transverse modes, e.g., transverse modes other possibly higher than fundamental mode) in the laser cavity.

In some designs, one or both reflectors 102, 104 can comprise a narrowband reflector. In some such implementations, the narrowband reflector(s) may be configured to only reflect light having wavelengths within a limited spectral range or wavelength interval centered on a center wavelength. In some examples, a laser wavelength of the corresponding laser may be substantially equal to the center wavelength. In various such designs, only cavity modes (e.g., longitudinal cavity modes) of the laser cavity having wavelengths within the limited spectral range or wavelength interval of the narrowband reflector(s) will be sustained in the laser cavity thereby limiting the number of lasing wavelengths (the one or more laser wavelengths) in the spectrum of the laser output. In some examples, at least one of the reflectors can comprise a narrowband filter with a bandwidth smaller than wavelength spacing between longitudinal modes of the laser cavity (herein referred to as free spectral range). In such a case, only one longitudinal cavity mode is sustained inside the laser cavity and the laser output may comprise a single laser wavelength. As a result, in such examples, a large amount of optical power can be outputted from a single longitudinal cavity and a single transverse cavity mode (corresponding to a single transverse mode of the second waveguide region 114). The laser wavelength may be substantially equal to wavelength of the single longitudinal mode.

In various designs, the laser device further comprises a phase control section 116. The phase control section 116 may, for example, be included in the waveguide 106, such as in the first waveguide region 112. In FIG. 1, for example, the phase control section is disposed near the first end 108 of the first waveguide region 112. The phase control section may comprise for example an electrode configured to apply an electrical signal to a portion of the waveguide to alter the refractive index thereof. Accordingly, in certain implementations, the phase control section 116 may alter the optical path length inside the optical cavity formed between the first 102 and the second 104 reflectors and therefore adjust or tune the wavelength of the corresponding cavity modes (e.g., longitudinal cavity modes). As such, in some embodiments, the phase control section 116 may be used to tune the one or more laser wavelengths.

In various implementations described herein, the waveguide 106, reflectors 102/104 and the phase control section 116 are disposed on a substrate with epitaxial layers of doped and undoped semiconductor material thereon. The waveguide region can be formed from variety of semiconductor materials including but not limited to IIIV semiconductor materials such as InP, GaAs, InGaAs, InAlAsP and GaN.

In some configuration, the reflectors and or the phase control section may also provide optical gain. Such components, may for example include material such as doped semiconductor and/or other semiconductor device structures that provide optical gain.

As discussed above, in various configurations, the semiconductor laser the first waveguide region has a width that supports only a single transverse mode (at the one or more laser wavelengths). In contrast, at least a portion of the second waveguide region may have a width that supports more than one transverse modes (at the one or more laser wavelengths). In the example shown in FIG. 1, the width of the first waveguide region can be constant, e.g., from its first end 108 to its second end 109. By contrast, the width of the second waveguide region increases from its first end 107 to its second end 110. In this example, the width of the two waveguides are matched at their interface. The width of the second waveguide region may increase linearly or non-linearly. In some implementations, the width of the second waveguide region may increase in a manner that substantially decouples the propagation of a preferred transverse mode (e.g. fundamental mode) from the propagation of higher order transverse modes. In some examples, a width profile of the second waveguide region may decouple the propagation of a preferred transverse mode (e.g. fundamental mode) from the propagation of higher order transverse modes, by increasing the propagation loss (e.g., radiative propagation loss) for the higher order transverse modes. In some cases, the width of the second waveguide region increases superlinearly, e.g., quadratically, exponentially, etc. As shown in the example laser device of FIG. 1, the waveguide, for example, in the second waveguide region 114 may be curved, e.g. have curved sidewalls. The waveguide, the sidewalls, and/or width need not be regularly shaped but may be irregularly shaped possibly not continuously increasing with distance from the first end 107 to the second end 110 of the second waveguide region 114. In some configurations, however, the width and/or shape of the waveguide and/or sidewalls changes smoothly, although the shape and configuration should not be limited. In some implementations, such as for a laser wavelength of 1550 nm, the constant width of the first waveguide region can be between 1 and 20 micron, and the width of the second waveguide region can vary between 10 micron and few hundred microns.

In some cases, the first and the second reflectors can be narrowband reflectors that provide reflection only for optical wavelengths within one or more narrow wavelength regions around one or more reflection peaks and possibly the laser wavelength. One or both reflectors can be comb reflectors such as discussed in U.S. Pat. No. 10,355,451, titled "Laser with Sampled Grating Distributed Bragg Reflector", filed on Apr. 25, 2018 and issued on Jul. 16, 2019 (Attorney Docket No. FREDOM.015A), U.S. patent application Ser. No. 62/901,089 filed on Sep. 16, 2019 titled "Tunable Laser with Active Material on at Least One End for Monitoring Performance" (Attorney Docket No. FREDOM.023PR), and U.S. patent application Ser. No. 17/021,993 filed on Sep. 15, 2020, titled "Tunable Laser with Active Material on at Least One End for Monitoring Performance" (Attorney Docket No. FREDOM.023A), which are each hereby incorporated herein in their entirety by reference, for example to provide various wavelength tunable laser designs. For example, an alignment between the reflectance spectrum of a comb reflector and wavelengths of cavity modes (longitudinal cavity modes) may be used to tune or select or tune the laser wavelength.

Figure 2:
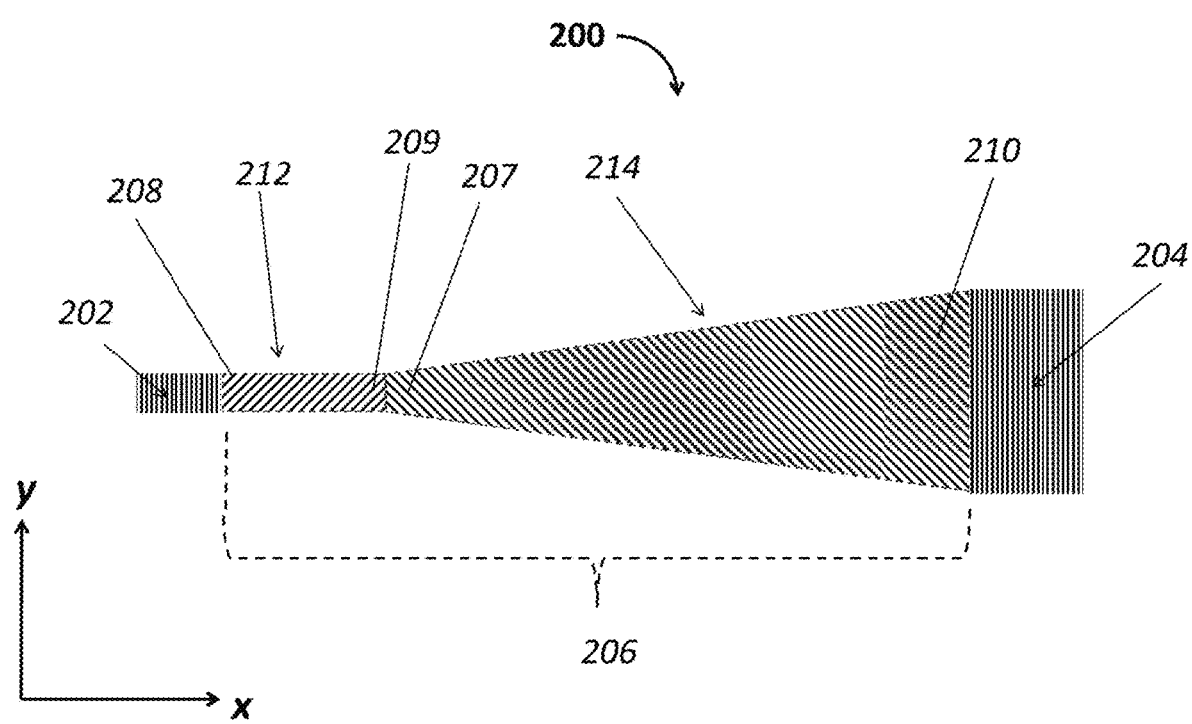
FIG. 2 illustrates a semiconductor laser comprising a waveguide and two Distributed Bragg Reflection (DBR) reflectors. The waveguide includes two waveguide regions, a first, rear waveguide region that is a single mode waveguide and the second, forward waveguide region that is flared and supports a number of transverse modes.

An example of such a semiconductor laser 200 having narrow band reflector is shown in FIG. 2. Like the laser shown in FIG. 1, the semiconductor laser 200 of FIG. 2 includes a waveguide having first and second, rearward and forward (or rear and front) waveguide regions 212, 214. The first rearward waveguide region 212 is a single (transverse) mode waveguide while the second forward waveguide region 214 is flared and supports multiple transverse modes. In this example shown in FIG. 2, the first waveguide region 212 is rectangular. The first waveguide region 212 has the same width in the lateral direction (parallel to the y-axis) from the first end to the second end. In certain implementations, this width may be sufficiently small such that the first waveguide region 212 supports only one transverse mode. In the example shown, the width of the first waveguide region 212 at the second end 209 is the same as the width of the first end 207 of the second waveguide region 214 where the two abut. In contrast with the shape of the first waveguide region 212, however, the second waveguide region 214 has a width that increases (e.g., progressively increases) toward its second end 210. The second waveguide region 214 may also be said to be tapered or to have a lateral width (parallel to the y-axis) that is tapered from the second end 210 to the first end 207 of the second waveguide region 214. The second waveguide region 214 (front and/or flared waveguide region) can have a length between 100 microns to 1 centimeter in some implementations or may have lengths outside this range depending on the design. In some cases, the lateral width of the waveguide increases over this length.

The first reflector 202, which may be referred to herein as a back reflector, is disposed at the first end 208 of the first waveguide region 212, and a second reflector 204, which may be referred to herein as front reflector, is disposed at the second end 210 of the second waveguide region 214. In example shown in FIG. 2, both reflectors are distributed Bragg reflectors (DBRs). Either of both of these reflectors may be formed on the same layer as the waveguide 206 or on a different layer such as a layer with a different composition. The second waveguide region 214 may continue increasing in width through (not shown) the front reflector 204 and possibly beyond. In some implementations, the width of the front reflector 204 may increase from one end to another as well although the width of the front reflector need not increase from one end to the other as shown in the example design in FIG. 2.

In various implementations, the waveguide regions 212, 214 can be configured to provide optical gain, for example, at the laser output wavelength (e.g. 1550 nm). For example, the at least a portion of the waveguide, e.g., at least one portion of the waveguide region(s) 212, 214, may be doped and/or may comprise, single junction, heterojunction, multi-quantum well heterojunction gain material. The waveguide regions 212, 214, can be activated (pumped) jointly or separately using a single or separate electric contacts that provide a current flow. As such the two waveguide regions may configured to provide the same or different levels of optical gain. The electric contacts may comprise one or several conductive strips disposed on the corresponding regions. In other embodiments the first waveguide region 212 is inactive and only the second waveguide region 214 is activated and is configured to provide optical gain. In some such implementations, the first waveguide region 212 may be formed from materials that are not configured to provide optical gain.

Figure 3:
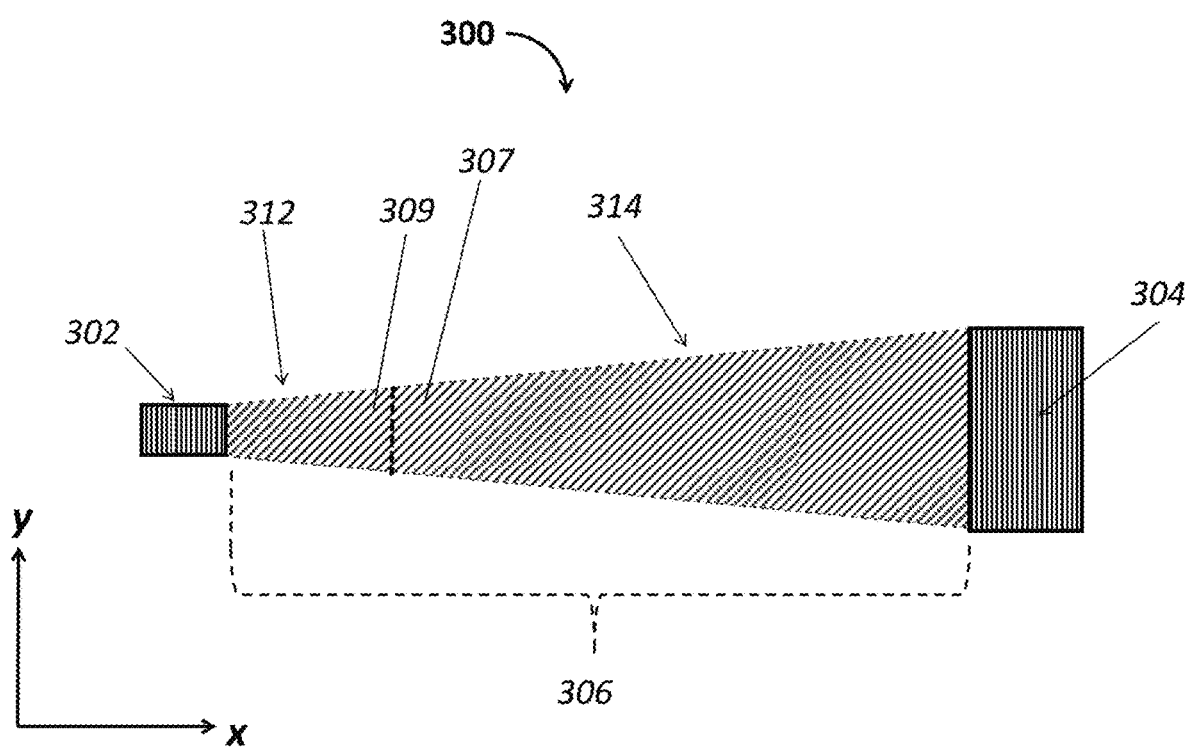
FIG. 3 illustrates a semiconductor laser comprising a waveguide and two DBR reflectors wherein the waveguide include front and rear waveguide regions that are both flared.

In some designs, both waveguide regions may be flared (or tapered). In some such implementations, first waveguide region 112 may support more than one transverse mode along part of its length (in other words it is not single mode along its entire length). In such designs, higher order transverse modes (e.g., modes higher than fundamental mode) in the laser cavity can be attenuated or eliminated, for example, by the section of the first waveguide region 112 near the first reflector 102 that support a single transverse mode for example by having a sufficiently reduced lateral width (along y-axis). Alternatively, or in addition, the higher order transverse modes can be attenuated or eliminated by the back reflector. For example, the size and/or configuration of the back reflector can be such that the higher order transverse modes are not reflected back to the optical cavity or reflection is sufficiently attenuated to introduce loss to other higher modes to cause the suppression thereof such that they do not lase (e.g., the resulting round trip loss for the higher mode is larger than the roundtrip gain). In yet other examples, the size and/or configuration of the back reflector and/or configuration of the first waveguide region can be such that the higher order transverse modes are not reflected back to the first waveguide region. FIG. 3 shows an example of such embodiment 300 where both waveguide regions of the waveguide 306 are flared (or tapered). Here, as above, the two waveguide regions, 312 and 314, have the same width at the second end 309 of the first waveguide region 312 and the edge of the first end 307 of the second waveguide region 314. However, the lateral width increases along the length of the both the first waveguide region 312 as well as the second waveguide region 314. In this example, the width is linearly increased with the same slope although as described above, the increase need not be linearly. Similarly, although the increase in width is continuous from one end to another in this example, the increase in width need not be continuous and may be interrupted. In some configurations, first second waveguide region 314 may be configured to provide optical gain while the first waveguide region 312 may not, while in other configurations both the first and second regions may be configured to provide optical gain.

In some configurations, the first 102 (back) reflector can be a narrowband reflector and the second 104 (front) reflector can be a broadband reflector. This broadband reflector can be partially or highly reflective but transmits a portion of the light such that light is output from the front of the laser. The broadband reflector can in some cases be a broadband DBR.

Alternatively, the broadband reflector can be a facet. The facet can, for example, be a cleaved facet, an etched facet or a trench partially etched into the substrate in the vicinity of the second end 110 of the second waveguide region 112. If the facet (e.g., etched waveguide) is desired to have low back-reflection, it may be angled relative to the cleaved surface of the chip (substrate).

Figure 4:
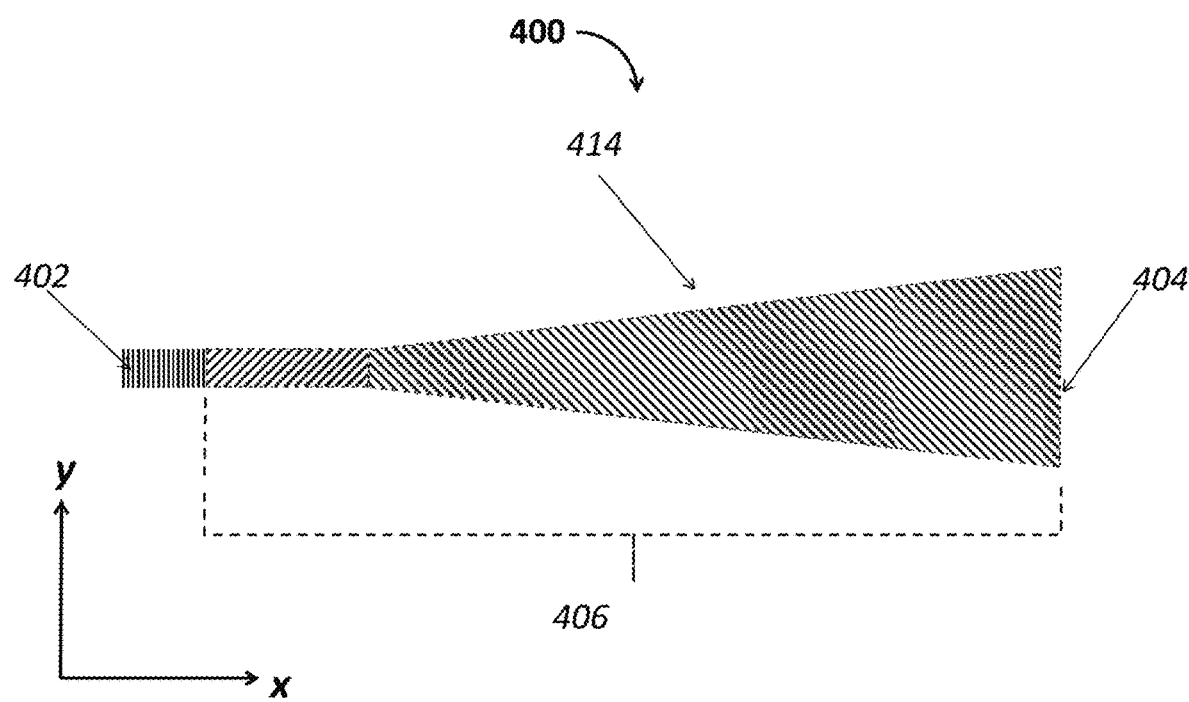
FIG. 4 illustrates a semiconductor laser comprising a waveguide with one DBR reflector and one reflective facet. The waveguide includes two waveguide regions: a first, rear waveguide region that has a constant width across its length and that comprises a single mode waveguide as well as a second, forward waveguide region that is flared. The width of the first, rearward waveguide region has a constant width as opposed to the forward waveguide region of the design shown in FIG. 1, which has a width that increases linearly.

FIG. 4 shows an example of the semiconductor laser 400 with a laser cavity formed between a DBR 402 and a reflective facet 404 (e.g., the facet of the second waveguide region 414), e.g., within waveguide 406. The facet 404 can be partially or highly reflective. The facet 404 is partially transmissive so as to transmit light from the laser cavity out of the laser. In some implementations, the edge of the waveguide facet 404 can be aligned with the edge of the chip. In that case a partially reflective facet can be formed by cleaving the waveguide and the chip together and the resulting cleaved facet will be partially reflective (possibly without any coating thereon). In contrast, a highly reflective facet can formed by a cleaved faced having a coating thereon such as a multilayer coating (e.g., multiple dielectric layers).

As discussed above, in various implementations, the first waveguide region 112 is configured to selectively attenuate, suppress, or eliminate higher order transverse modes (such as higher order modes supported by the second waveguide region 114) by providing significantly higher optical loss. In some designs, this loss is be introduced by the reduced width of the waveguide in the first waveguide region 112. In some other designs, the first waveguide region 112 may be configured to introduce loss to higher order modes using other approaches. In some designs, for example, the waveguide in the first waveguide region 112 may have a shape or other feature(s) configured to increase scattering or radiation of higher order modes.

As discussed above, the first waveguide region 112 may have a width that may support a single or few transverse modes (at the laser wavelength) such that effectively only the fundamental transverse mode survives passing through the first waveguide region. The second waveguide region 114 may have a flared width that supports more than one transverse modes (at the laser wavelength).

Figure 5:
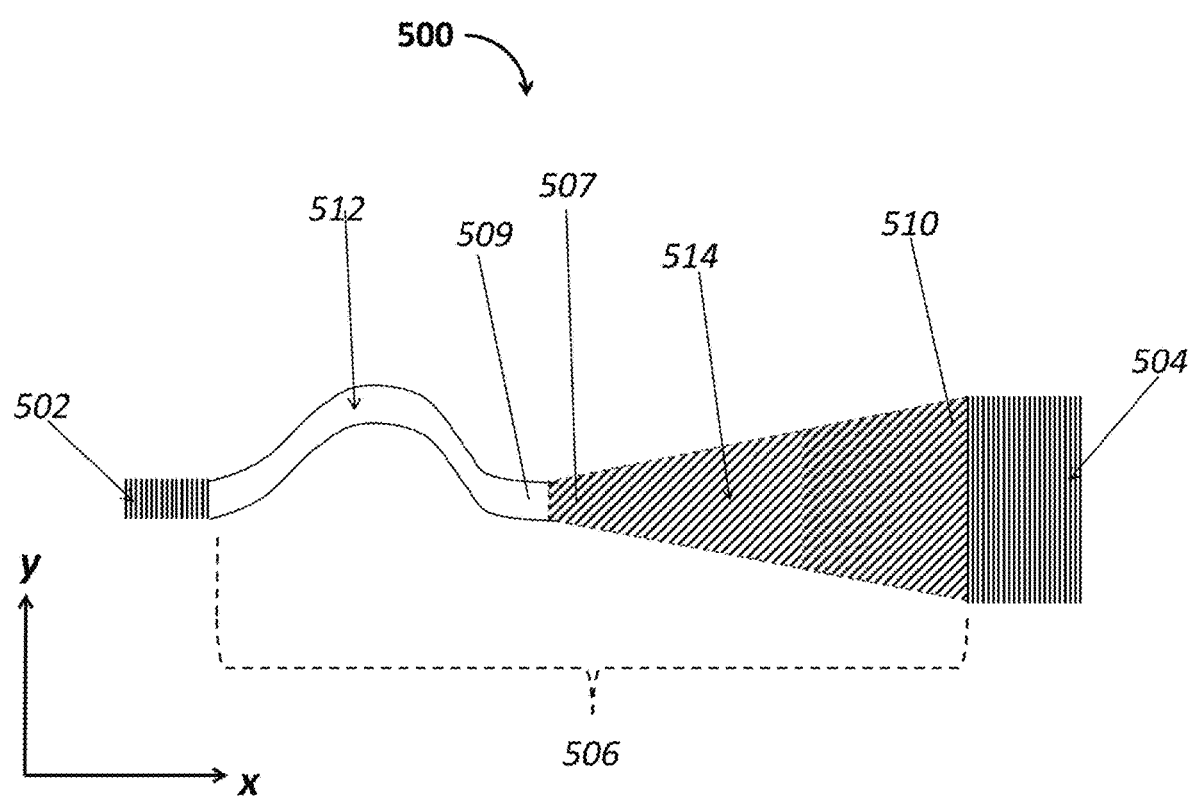
FIG. 5 illustrates another semiconductor laser comprising a waveguide and two DBR reflectors. The waveguide includes two waveguide regions: a first, rearward waveguide region that is curved so as to scatter higher order modes and a second, forward waveguide region that is flared and supports a number of transverse modes.

An example of such laser design 500 that includes a waveguide having a shape in the first waveguide region that introduces losses to higher order modes is shown in FIG. 5. In this example, the laser comprises a back reflector 502 and a front reflector 504 that are both distributed Bragg reflectors (DBRs). The first waveguide region 512 may have a constant width while the second waveguide region 514 is flared with a width at its first end 507 (e.g., at the rear or rear edge of the second region) that is matched to that of the first waveguide region 512 at its second end 509 (e.g., at the front or front edge of the first region) and progressively increases toward the its second end 510.

Notably, in the example shown in FIG. 5, at least a portion of the waveguide in the first waveguide region 512 is not linear (e.g., is not aligned along a straight line such as the x-axis). In this example, the portion of the waveguide is curved. In particular, in this example, the portion of the waveguide includes a curved optical path. This non-linear optical path may cause scattering of light propagating within the first waveguide region 512. Optical confinement may thus be reduced by this shape. More particularly, this curve may introduce loss (e.g., radiative or scattering loss) to one or more higher order transverse modes. Consequently, such higher order transverse modes may have higher levels of loss that suppress, attenuate or reduce lasing of such higher order transverse modes.

In the example shown in FIG. 5, the width of the waveguide in the first region is constant although the width need not be so. This width may be reduced so as to limit the number of modes that are supported by the waveguide in the first region. In certain implementations, such as for example for a laser wavelength of 1550 nm, the width (e.g., constant) of the first waveguide region can be between 1 and 20 microns.

As with other examples discussed above, in the laser of FIG. 5, the width of the second waveguide region may grow linearly or non-linearly (e.g., superlinearly such as exponentially). In some implementations, the width of the waveguide in the second waveguide region can vary between 10 micron and 500 microns. In some implementations, the first and the second reflectors can be narrowband reflectors (e.g. DBR) with high optical reflection within a narrow wavelength region around the laser wavelength. The reflectors may also support optical gain in some designs although need not be so limited.

In any of the implementations discussed herein such as those described above, the narrow band reflectors (e.g., the spectral reflectance of the narrow band reflectors) can be electrically or thermally tunable. For example, for thermal tuning, resistive heaters can be disposed on or sufficiently close to the reflectors (e.g., narrow band reflectors) to change their center wavelength via thermo-optic effect. The temperature of the corresponding reflector can be changed by providing electric current to the resistive heater using individual electric contacts (electrodes). Other techniques can be used to provide tuning. For example, electric contacts can be directly disposed on the reflectors to change their center wavelength via electro-optic effect. As such the reflectance spectrum of each reflector can be independently controlled by the current or voltage provided via the electrodes disposed on the reflectors (which are electrically isolated from the other electrodes driving the gain and phase control regions). In some examples, the wavelengths of one or more cavity modes (e.g., longitudinal cavity modes) may be controlled by tuning the reflectance spectrum of a reflector (a narrow band reflector) using the methods described above. Accordingly, in various implementations, the one or more laser wavelength can be tuned, for example by applying an electrical signal to one or more electrodes associated with one or more reflectors. In some embodiments, at least one of the reflectors may have a plurality of narrowband reflection peaks (e.g., a comb line reflectance spectrum). In some such embodiments, tuning the reflectance spectrum of one or more reflectors (using the above mentioned methods), or a phase section (e.g., phase section 116) may be used to tune or select a single laser wavelength, for example, by controlling an alignments between the one or more narrow band reflection peaks and that cavity modes (longitudinal modes of the laser cavity).

Examples of configurations useful for providing laser wavelength tuning are discussed in U.S. Pat. No. 10,355,451 issued Jul. 16, 2019, U.S. patent application Ser. No. 62/901089 filed on Sep. 16, 2019, and U.S. patent application Ser. No. 17/021993 filed on Sep. 15, 2020, which are hereby incorporated in their entirety by reference herein.

Accordingly, in various designs, the narrow band reflector can comprise a comb reflector such as described in U.S. Pat. No. 10,355,451 issued Jul. 16, 2019, U.S. patent application Ser. No. 62/901089 filed on Sep. 16, 2019, and U.S. patent application Ser. No. 17/021993 filed on Sep. 15, 2020, which are incorporated in their entirety by reference herein. Such a comb reflector may be capable of producing a reflection spectrum comprising plurality of reflection peaks or amplitude peaks spaced apart in frequency. In some implementations, these reflection or amplitude peaks may be equally spaced apart in frequency. An example of a comb reflector is a sampled grating distributed Bragg reflector (SGDBR). Such a SGDBR may comprises, for example, a series of Bragg gratings spaced apart from each other by a regions that do not include grating structures. Using comb mirror as one of the reflectors may provide certain capabilities (e.g. tuning the laser wavelength, tailoring the laser spectrum) such as, for example, described in U.S. Pat. No. 10,355,451, titled "Laser with Sampled Grating Distributed Bragg Reflector", filed on Apr. 25, 2018 and issued on Jul. 16, 2019 (Attorney Docket No. FREDOM.015A), U.S. patent application Ser. No. 62/901,089 filed on Sep. 16, 2019 titled "Tunable Laser with Active Material on at Least One End for Monitoring Performance" (Attorney Docket No. FREDOM.023PR), and U.S. patent application Ser. No. 17/021,993 filed on Sep. 15, 2020, titled "Tunable Laser with Active Material on at Least One End for Monitoring Performance" (Attorney Docket No. FREDOM.023A), which are each hereby incorporated herein in their entirety by reference .

Additionally, in any of the implementations discussed herein such as the designs described above, the first waveguide region may include a phase section that can be configured to control the wavelengths of one or more cavity modes of the cavity formed between the two reflectors. In some examples, wavelengths of the one or more cavity modes can be longitudinal resonant wavelengths of the cavity (laser cavity). In some implementations, the phase section can be positioned near the first end of the first waveguide region. The phase section can be formed from the same or different material from the material used to form the waveguide and may or may not provide optical gain.

Furthermore, in any of the implementations discussed herein such as the designs described above, the reflectors (DBRs, broadband reflectors and comb reflectors) can also provide optical gain. The current (or voltage) for activating the reflectors may be provided by the same electrodes that provide current to the waveguide regions or by separate electrodes. The current (or voltage) can be provided along the entire length of the reflector or along a portion of the reflector (in which case only that portion may provide gain). In these implementations, the reflectors can be formed from a semiconductor gain material similar to the material used in the waveguide region or a different material.

Figure 6A:
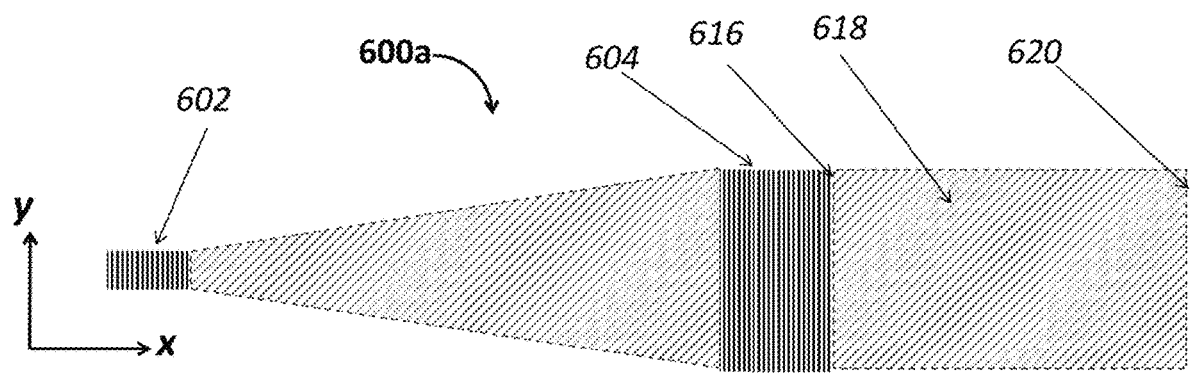
FIG. 6A shows a semiconductor laser similar to that shown in FIG. 2 further comprising an additional amplifying waveguide section that has a constant width along its length.
Figure 6B:
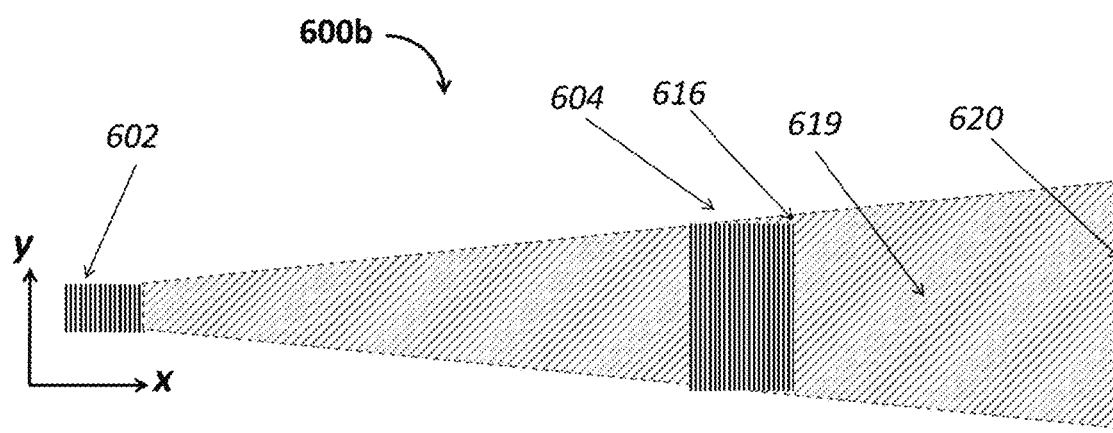
FIG. 6B shows a semiconductor laser similar to that depicted in FIG. 2 further comprising an additional amplifying waveguide section that is flared. The additional amplifying waveguide section may have an end facet through which output light is emitted, and this end facet may include an anti-reflection (AR) coating thereon.

Also, in any of the implementations discussed herein such as the designs described above, an optical gain region can be added to the laser in order to further amplify the output power. This additional optical gain region can be a flared region although this region need not be flared. The current for activating the additional gain region may be provided by the same electrodes that provide current to the waveguide regions in the laser cavity or by a separate electrode. FIG. 6(*a*) shows an example of a laser device 600*a* comprising the laser configuration 300 such as shown in FIG. 3 and an additional gain region 618. This gain region comprises an additional waveguide portion 618 outside the laser cavity (e.g., formed between a first reflector 602 and a second reflector 604), which provides amplification of light output from the laser cavity. In this example, the waveguide portion in the gain region 618 has a constant width between its first 616 and second 620 ends thereof. The first end 616 of gain region 618 is disposed to receive light that is transmitted through the second DBR reflector 604 and thus from the laser cavity and the laser. The width of the additional optical gain region 618 can be equal to the width of the second DBR 604 although the design need not be so limiting. In some implementations, the second end 620 of the additional gain region 618 can be AR coated to reduce back reflection. FIG. 6(*b*) shows another example of a laser device 600*b* comprising the laser 300 such as shown in FIG. 3 and an additional gain region 619. This gain region comprises an additional waveguide portion outside the laser cavity that provides amplification of light output from the laser. This waveguide portion has a lateral width that increases in size along longitudinal direction (parallel to the x-axis) from its first end 616 to its second end 620. As shown, the first end 616 of the additional gain region 619 is disposed to receive light that is transmitted through the second DBR reflector 604 and thus from the laser cavity and the laser. The width of the additional optical gain region at its first end 616 can be equal to the width of the second DBR 616. The flared design of the additional optical gain region 619 may provide increased area over which optical gain can be provided to amplify the signal. The second end 620 of the additional gain region 618 of the laser 600*a* (or the additional gain region 619 of the laser 600*b*), can be AR (anti-reflection) coated to avoid the formation of a second laser cavity within the additional gain region.

Figure 7A:
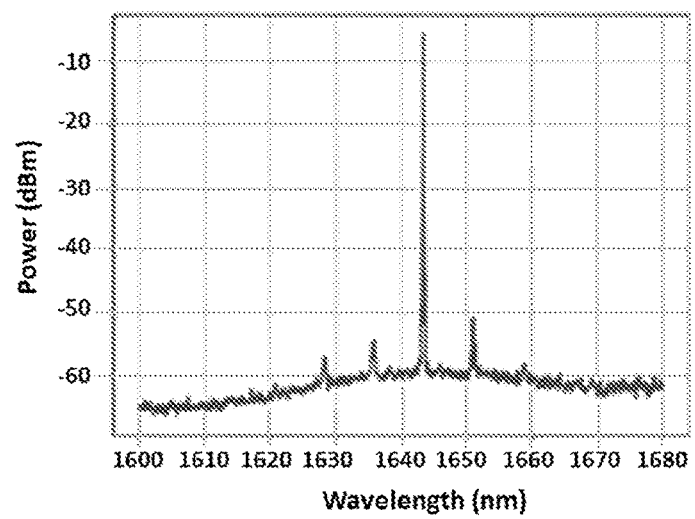
FIG. 7A shows a measured spectrum on axes of power (in dBm) vs. wavelength (in nanometers) for an example semiconductor laser design having an optical amplified appended thereto such as shown in FIGS. 6A and 6B.
Figure 7B:
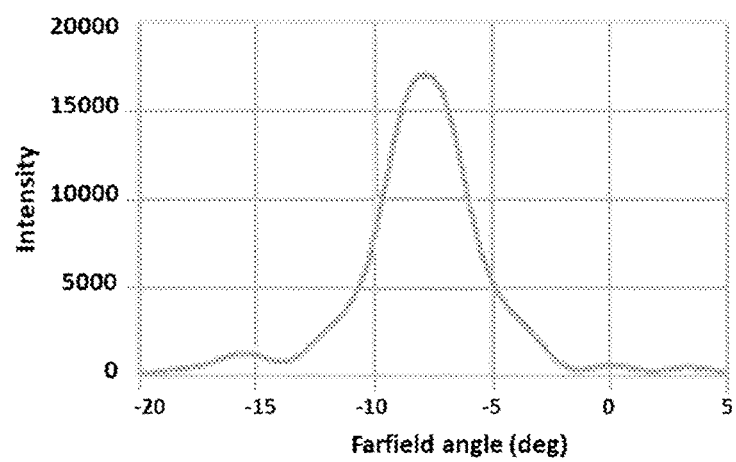
FIG. 7B shows a far-field angular intensity profile on axis of intensity (in relative units) v. far field angle (in degrees) along horizontal direction for an example semiconductor laser design having an optical amplified appended thereto such as shown in FIGS. 6A and 6B.
Figure 7C:
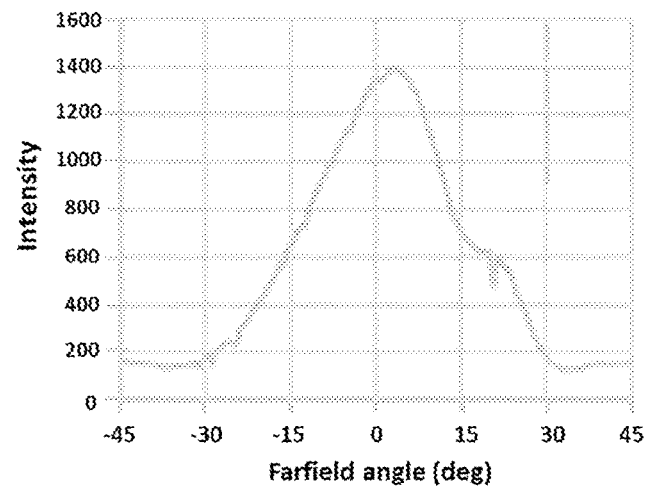
FIG. 7C shows a far-field angular intensity profile on axis of intensity (in relative units) v. far field angle (in degrees) along vertical direction, for an example semiconductor laser design having an optical amplified appended thereto such as shown in FIGS. 6A and 6B.

As discussed above, various implementations disclosed herein may potentially provide single mode operation and single mode laser output. Such single mode laser output may be advantageous for certain applications. For illustrative purposes, FIG. 7A-7C show the measured experimental results (i.e. output spectrum and output beam profile) for semiconductor laser have a design similar to that shown in FIG. 6A. The measured output power extracted from this device was about 700 mW in the continuous wave (CW) mode of operation. Without subscribing to any particular scientific theory, the presence of only one peak wavelength in measured output spectrum show in FIG. 7A from the device appear to provides evidence that potentially only one longitudinal mode is formed and outputted. Additionally, without subscribing to any particular scientific theory, the measured far field angular profiles in the horizontal direction shown FIG. 7B and the vertical direction shown in FIG. 7C appear to indicate that the laser beam may have only one spatial mode. Again, without subscribing to any particular scientific theory, these results appear to provide evidence that possibly demonstrates existence of only one transverse mode within the laser cavity despite one or more other regions in the laser cavity and/or the entire length of the amplifier being capable of guiding several higher order transverse modes.

In some implementations, the semiconductor laser 100 may be tunable laser Y-branch laser where waveguide 106 comprises a Y-branch waveguide with at least one flared waveguide region that provides optical gain (flared gain region). A Y-branch laser may comprise a first branch comprising a first reflector, a second branch comprising a second reflector, third branch comprising a third reflector, a flared gain region, for example, in at least one of the branches. In some implementations, the Y-branch laser may include a Y-branch splitter. In some implementations, the Y-branch laser may comprise one or more single mode waveguide regions (e.g., waveguide regions that only support one transverse mode at the laser wavelength).

In some designs, at least one of the reflectors may be a narrowband reflector such as DBR or SGDBR. In some cases, the narrow band reflector may be electrically tunable as described above (e.g., using a resistive heater). In some implementations, the Y-branch laser may include one or more phase sections. The one or more phase sections can be regions of a waveguide whose refractive index can be electrically tuned (e.g., using thermo-optically or electro-optically modulation or tuning). In various of these implementations, one or more of the Y-branch splitter, the single mode waveguide regions, and the flared gain region, the reflectors and the optional phase section(s) may be configured to support tunable single mode optical resonance within the laser cavity and therefore enable single mode laser output with tunable wavelength. The tunability may be provided, for example, using the Vernier effect between cavity modes and the reflection peaks of the SGDBR such as described in U.S. Pat. No. 10,320,152, titled "Tunable Laser" filed on Mar. 28, 2018 and issued on Jun. 11, 2019 (Attorney Docket No. FREDOM.011A) as well as U.S. Pat. No. 10,355,451, titled "Laser with Sampled Grating Distributed Bragg Reflector", filed on Apr. 25, 2018 and issued on Jul. 16, 2019 (Attorney Docket No. FREDOM.015A), which are each hereby incorporated herein by reference in their entirety. The flared gain region combined with the single mode waveguide regions may provide high optical gain without supporting low loss optical paths for higher order transverse modes that may interfere with tunable single mode optical resonance.

Figure 8:
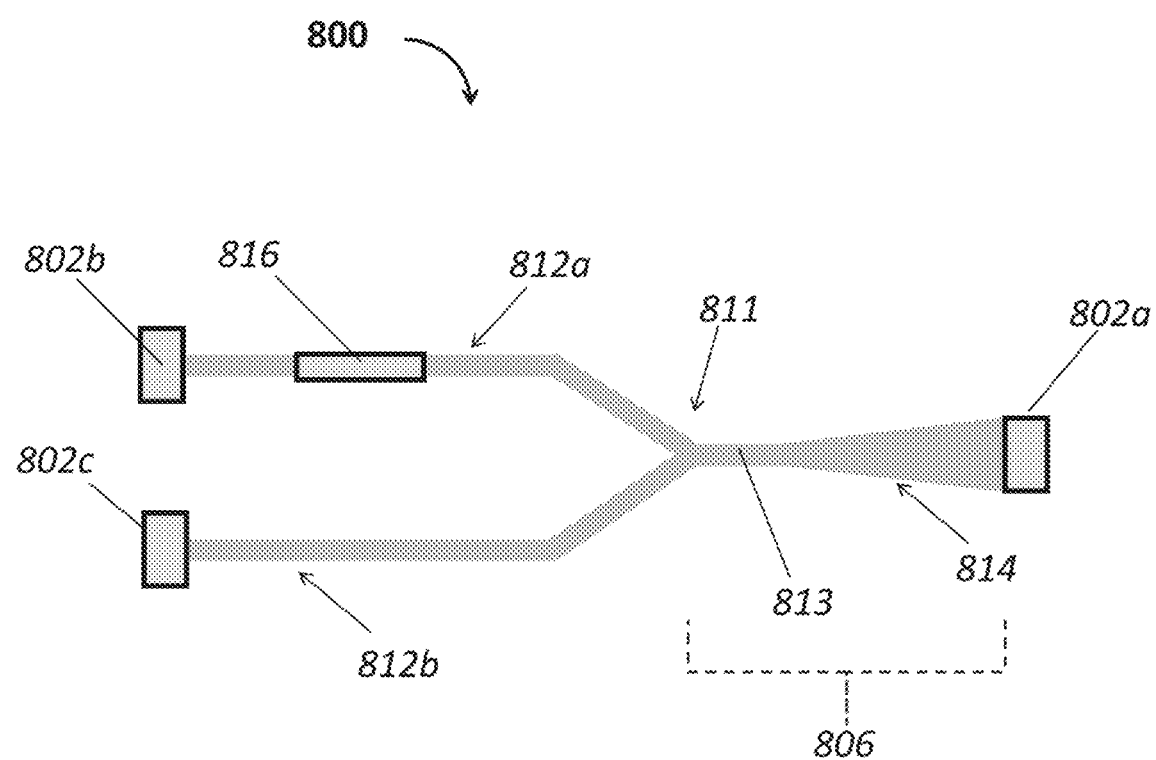
FIG. 8 illustrates a Y-branch semiconductor laser comprising a single mode Y-coupler, three waveguide branches and three reflectors. One of the waveguides includes two waveguide regions, a first waveguide region that is a single mode waveguide and the second waveguide region that is flared.

FIG. 8 shows an example of such Y-branch laser 800, comprising a single mode Y-coupler 811 that couples a proximal end of a first waveguide branch 806 to a proximal end of a second 812*a* waveguide branch and a proximal end of a third waveguide branch 812*b* waveguide branch. The Y-coupler 811 may be configured to couple light from the first waveguide branch 806 to the second 812*a* and third 812*b* waveguide branches and/or from the second 812*a* and third 812*b* waveguide branches to the first waveguide branch 806. The first waveguide branch 806 may comprise a single mode waveguide region 813 and a flared waveguide region 814. The second 812*a* and the third waveguide 812*b* branches may be single mode waveguides. A first reflector 802*a* may be disposed at the distal end of the first waveguide branch 806. Similarly, a second reflector 802*b* may be disposed at the distal end of the second waveguide branch 812*a* and a third reflector 802*c* may be disposed at the distal end of the third waveguide branch 812*b*. The second waveguide branch 812*a* may include a phase section 816 (e.g., an electrically or thermally tunable phase section). The phase section 816 may enable electrical tuning of the phase of a guided optical wave propagating in the second branch 812*a*. In some cases, the first reflector 802*a* may be broadband mirror, the second 802*b* may be a DBR and the third reflector 802*c* may be an SGDBR. The flared 814 and the single mode 813 waveguide regions of the first waveguide branch 806 may support a single transverse mode (at a laser wavelength) despite that some parts of the flared waveguide 814 may support higher order transverse modes (as described above). The flared waveguide region 814 may provide high optical gain while the other sections of the Y-branch laser 800 may support tunable single mode resonant wavelength (e.g., tunable using the phase section 816 or by tuning a spectral reflectance of one or more of the reflectors). As such, the Y-branch laser 800 can generate high power laser light with a tunable wavelength. In various implementations, any of the reflectors 802*a*, 802*b*, 802*c* can be a broad band reflector or a narrow band reflector, a DBG or a SGDBR. In some implementations, the flared region 814 may be included in the second branch 812*a* or the third branch 812*b*. Additionally, phase sections may be included in any one or more of the branches, for example, to support wavelength tuning. One or more of the reflectors, e.g., narrow band reflector(s), DBG reflector(s), SGDBR reflector(s), etc., may also be tunable, for example, electrically or thermally.

While the foregoing detailed description discloses several embodiments of the present invention, it should be understood that this disclosure is illustrative only and is not limiting of the present invention. It should be appreciated that the specific configurations and operations disclosed can differ from those described above, and that the apparatus and methods described herein can be used in contexts. Additionally, components can be added, removed, and/or rearranged. Additionally, processing steps may be added, removed, or reordered. A wide variety of designs and approaches are possible.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A semiconductor laser comprising:
   a waveguide comprising:
   (i) a first waveguide region extending in a longitudinal direction between first and second ends of said first waveguide region and having a width extending in a lateral direction, said width of said first waveguide region being configured such that said first waveguide region supports a single bound transverse mode; and
   (ii) a second waveguide region extending in a longitudinal direction between first and second ends of said second waveguide region and having a width extending in a lateral direction; and
   first and second optical reflectors, said first and second waveguide regions disposed between said first and second optical reflectors, said first optical reflector closer to said first end of said first waveguide region than said second end of said first waveguide region, said second optical reflector closer to said second end of said second waveguide region than said first end of said second waveguide region, said first and second optical reflectors disposed with respect to each other to form a laser cavity therebetween;
   wherein the width of said second waveguide region at said second end of said second waveguide region is larger than the width at said first end of said second waveguide region;
   wherein at least a portion of said second waveguide region comprises a semiconductor gain material configured to provide optical gain for light propagating within said laser cavity;
   wherein at least the first optical reflector comprises a distributed Bragg reflector (DBR) and is formed from a material different from the semiconductor gain material; and
   wherein said second waveguide region is configured to support a plurality of bound transverse modes, and the laser cavity sustains and outputs a single transverse mode.

2. The laser of claim 1, wherein the width of said second waveguide region is configured such that said second waveguide region supports multiple bound transverse modes.

3. The laser of claim 2, wherein the width of said second waveguide region along the entire longitudinal direction is equal to or greater than a maximum width of said first waveguide region.

4. The laser of claim 1, wherein the width of said first region is in a range from 1 to 20 microns.

5. The laser of claim 2, wherein the width of said second region is in a range from 10 and 500 microns.

6. The laser of claim 2, wherein the width of the second waveguide region increases progressively from said first end to said second end.

7. The laser of claim 1, wherein the width of the first waveguide region increases progressively from said first end to said second end.

8. The laser of claim 1, wherein said first optical reflector or said second optical reflector comprises a comb mirror.

9. The laser of claim 1, wherein one or both first optical reflector and said second optical reflector comprise a narrow band reflector.

10. The laser of claim 1, wherein one or both said first optical reflector and said second optical reflector comprise a passive element.

11. The laser of claim 1, wherein one or both said first optical reflector and said second optical reflector are configured to provide gain.

12. The laser of claim 1, further comprising an electrode disposed with respect to said first optical reflector to apply an electric signal thereto to tune said first optical reflector.

13. The laser of claim 1, further comprising an electrode disposed with respect to said second optical reflector to apply an electric signal thereto to tune said second optical reflector.

14. The laser of claim 1, wherein said waveguide further comprises a tunable phase section having an index of refraction that can be adjusted to increase or decrease the optical path length in said section of said waveguide.

15. The laser of claim 1, further comprising an optical amplifier at said second end of said second waveguide region.

16. The laser of claim 1, wherein said first waveguide region and said first optical reflector are configured to reflect only one bound transverse mode.

17. The laser of claim 1, wherein said second waveguide region is configured to provide optical gain to a plurality of bound transverse modes.

18. The laser of claim 1, wherein said first waveguide region is configured to increase loss of bound transverse modes higher than a fundamental mode.

19. The laser of claim 1, wherein the laser comprises a Y branch laser, and wherein the first and the second waveguide regions are included in at least one branch of the Y branch laser.

20. The laser of claim 1, wherein a first portion of the first waveguide region and a second portion of the second waveguide region are configured to provide optical gain for light propagating within said laser cavity and the first portion and the second portion are configured to be activated separately using separate electric contacts.

21. The laser of claim 1, wherein the single transverse mode output by the laser cavity is a fundamental mode.

22. The laser of claim 1, wherein the width of the second optical reflector is equal to the width the second waveguide region at the second end.

23. The laser of claim 6, wherein the second width of the second waveguide region increases in a manner that substantially decouples propagation of a bound transverse mode from propagation of other bound transverse modes of the second plurality of bound transverse modes.

24. The laser of claim 23, wherein the width of the second waveguide region increases nonlinearly.

25. The laser of claim 1, wherein the first waveguide region is formed from a material different from the semiconductor gain material, and is not configured to provide gain for light propagating within said laser cavity.

26. The laser of claim 1, wherein the combination of said first waveguide region and said first reflector are configured to preferentially support lasing of only a single transverse mode in the laser cavity.

27. The laser of claim 1, wherein the second optical reflector is formed from a material different from the semiconductor gain material.

28. The laser of claim 9, wherein the second optical reflector comprises a Distributed Bragg Reflectors (DBR).

29. The laser of claim 1, wherein said width of the first waveguide region is substantially the same at the first and the second ends of said first waveguide region.

\* \* \* \* \*